United States Patent [19]
Miyoshi et al.

[11] Patent Number: 5,569,392
[45] Date of Patent: Oct. 29, 1996

[54] METHOD AND APPARATUS FOR REPAIRING DEFECT ON PLANE SURFACE OF PHASE SHIFT MASK

[75] Inventors: Motosuke Miyoshi, Tokyo-to, Japan; Katsuya Okumura, Poughkeepsie, N.Y.

[73] Assignee: Kabushiki Kaisha Toshiba, Kawasaki, Japan

[21] Appl. No.: 364,227

[22] Filed: Dec. 27, 1994

[30] Foreign Application Priority Data

Dec. 27, 1993 [JP] Japan .................................. 5-331484

[51] Int. Cl.$^6$ ........................................................ B44C 1/22
[52] U.S. Cl. .............................. 216/60; 216/24; 216/66; 216/81; 156/345
[58] Field of Search .................................. 216/11, 21, 24, 216/38, 59, 60, 66, 80, 81, 12; 156/345 M, 345 C

[56] References Cited

U.S. PATENT DOCUMENTS 5,358,806  10/1994  Haraichi et al. ...................... 216/60 X

OTHER PUBLICATIONS

Journal of Physics E: Scientific Instruments 1971, vol. 4, R. A. Hoover, "Measuring Surface Variations With the Scanning Electron Microscope Using Deposited Contamination Lines", pp. 747–749.

*Primary Examiner*—William Powell
*Attorney, Agent, or Firm*—Oblon, Spivak, McClelland, Maier & Neustadt, P.C.

[57] ABSTRACT

At eliminating a bump defect having a partially projecting shape in a region to be flat, a carbon deposit layer covering the bump defect is etched under the condition of a selectivity of 1:1 of an etching rate of a carbon and mask material at least until the bump defect is exposed, a carbon line is formed by depositing a carbon along a straight line in view of the surface thereof, a discrepancy amount is measured between an etched carbon surface and a carbon line on a flat mask surface on the basis of an observation of the phase shift mask in the oblique direction to the surface, and the carbon deposit layer and carbon line remaining on the mask are perfectly eliminated by etching until the discrepancy amount becomes zero, thereby providing a method and apparatus for repairing the defect on the phase shift mask capable of observing in situ an etching amount.

8 Claims, 8 Drawing Sheets

METHOD AND APPARATUS FOR REPAIRING DEFECT ON PLANE SURFACE OF PHASE SHIFT MASK

BACKGROUND OF THE INVENTION

The present invention relates to a method of and apparatus for correcting defects on a plane surface of a phase shift mask, and more particularly to a method of and apparatus for repairing defects by means of removing a bump defect which partially projects from a region to be flat or plane.

When an etching is performed with respect to the bump defect for a repair in order to remove the bump defect on the phase shift mask, it is necessary to stop the etching at a stage where the etching to a level as the same as a reference plane is performed. The reason why the etching is stopped is that, if the etching is continued over the necessity, there is generated a new region in which a phase changes, thereby resulting that the new region becomes a new defect. Accordingly, it is necessary to properly monitor an etching amount with respect to the bump defect, namely, a depth of the etching, and at the same time, it is necessary to properly monitor exact quantities of the etching to the reference plane corresponding to a reference phase. Therefore, the followings (A)–(D) have been proposed as main method for measuring a fine height and depth:

(A) Probe method;

The method is that a fine probe traces a bump and divot defect on a surface of a sample by moving with a contact to the sample surface with extremely small contact pressure, for example, several milligram (mg) or several microgram (μg). Both of an STM (Scanning Tunneling Microscope) and an AFM (Atomic Force Microscope) measure a bump and divot defect by the basically same principle as the probe method.

(B) Stereoscopy method;

The method is that a sample is investigated from two different angles to obtain a two-dimensional electronic image, a characteristic point is extracted from the image, and a parameter denoting the bump and divot defect such as a height or incline angle of an edge is calculated on the basis of a discrepancy amount of the image by using the characteristic point as the standard. This method is widely used in a measurement of the shape processed in a semiconductor field, and disclosed in "M.Miyoshi, F.Komatsu, N.Matsuda and K.Okumura, Measurement of the geometrical dimensions in the VLSI using the scanning electron microscope, Proc. XIth Int.Cong. on Electron Microscopy, Kyoto, 1986, pp.657–658", for example.

(C) Double detector method;

The method is to calculate a slant angle $\Phi$ which is an angle between the sample surface and a virtual vertical axis, a height h and a section profile on the basis of strength signals a and b detected from two detectors A and B which are disposed at positions each symmetrical to an optical axis in accordance with the following equations (1):

$$\tan \Phi = k(a^2 - b^2)/(a_N + b_N)^2 \quad (1)$$

Where k is a coefficient, and $a_N$ and $b_N$ are a signal strength of the detectors A and B at $\Phi=0°$, respectively. A range of $\Phi$ is less than 75 degrees to establish the above equation (1). This is described in "Extended Abstract of the 32-th Spring Meeting of JSAP (1985), p.333(29p-k-9), 'A section measurement by SEM' written by Suganuma".

(D) Contamination method;

The method is a simple method for measuring a three-dimensional shape, in which a measured object is scanned along a straight line by a vertical incidence having a slant angle a=0° against the sample to form a contamination line on a surface of the sample, then the sample is inclined, and parameters such as a slant angle $\Phi$ and a height h for representing the three-dimensional shape are obtained from a change amount of the contaminating line caused by an inclination of the sample. This content is disclosed in "R.A.Hoover, Measuring surface variations with the scanning electron microscope using deposited contamination lines, J. Phys. E. Sci. In strum 4, pp. 747–749, 1971".

It is desired to apply a so-called in situ measurement which measures a depth of the sample as it is without taking-out in a field of a sputtering (an ion milling) using a focused ion beam (IFB) generation apparatus and a beam assist etching using a charge beam such as an ion and an electron beam.

In the case where it is necessary to process by a focused ion beam in order to correct a defect of a phase shift mask, the in situ measurement is the only method for the measurement in order to increase a processing precision.

However, since it is necessary for the contact needle method or scanning probe method described in the above paragraph (A) to measure the sample in a different position by one taking out the sample, the method can not be called as the in situ measurement.

Furthermore, the stereoscopy method of the item (B) is easy to apply to the in situ measurement in view of the etching by the ion beam or the electron beam as a premise. However, even though he method is suitable for a measurement of the etching depth and an elimination of a defect or a deposit layer having the known height, the method is unsuitable for the etching to the defect and layer having an unknown height, namely, a requirement that the etching must be stopped at the point coinciding with the reference plane.

Still furthermore, the double detectors method of the item (C) is not practical because an application range of the measurable inclined angle $\Phi$ is limited less than 75°, and this method is also unsuitable for the etching without the occasion that the height of the defect has been previously known in the same manner of the stereoscopy method.

Moreover, the contamination method of the item (D) results a pollution of the sample because the contamination is positively added to the sample, thereby not applying in the semiconductor field.

SUMMARY OF THE INVENTION

In view of the above-mentioned condition, an object of the present invention is to provide a method and apparatus for repairing a defect of a phase shift mask capable of monitoring in situ an etching amount, namely, a depth of the etching at a repair a defect in the phase shift mask, thereby precisely eliminating a bump defect.

A method of repairing defect of a phase shift mask according to the present invention for eliminating a bump defect which partially projects from a region to be flat, comprises a step of forming a carbon deposit layer by depositing a carbon in the manner of covering the bump defect, a step of etching a partial region including and larger than the bump defect within a carbon deposit region in the carbon deposit layer under the condition of selectivity "1" of an etching rate of carbon and mask material at least until the bump defect exposes, a step of forming a carbon line by depositing a carbon along the straight line in view from an upper side of a surface in the manner of including surfaces of the carbon and the bump defect which are etched, a step of measuring a discrepancy amount between a carbon line on an etched carbon surface and a carbon line of the flat mask surface by observing the phase shift mask from the oblique direction of the mask surface and at the same time of etching the partial region under the condition of the selectivity "1" of the etching rate between the carbon and mask material until the discrepancy amount becomes zero, and a step of eliminating entire of the carbon deposit layer and the carbon line remaining on the mask.

The present invention desirably comprises a step of forming a carbon line by depositing a carbon along the straight line in view from the upper side of the surface in the manner of including the flat mask surface and the bump defect surface previous to the step of the carbon deposit layer, and a step of measuring the discrepancy amount between the carbon line on the surface of the bump defect and the carbon line on the surface of the flat mask by observing the phase shift mask from the oblique direction of the surface and at the same time of determining a layer thickness of the carbon deposit layer on the basis of the height of the bump defect previously calculated.

An apparatus for repairing a defect of a phase shift mask according to the present invention, comprises a stage supporting a phase shift mask as a corrected object thereon, beam radiating means for radiating a focus ion beam to the phase shift mask, hydro-carbon supply means for supplying a hydro-carbon onto a surface of the phase shift mask, surface observation means for observing the surface of the phase shift mask by detecting a secondary electron, tilting means for tilting an observing angle of the surface observation to the phase shift mask, and operation processing means for manipulating the beam radiating means, the hydrocarbon supply means and the tilting means on the basis of an observed result of the surface observation means.

Even though it is impossible to adopt the contamination method in the semiconductor field because the sample is easy to be polluted, it becomes to be discovered that the pollution is no problem in the repair of the defect by a focus ion beam generation apparatus. The method of repairing a defect according to the present invention is performed in view of these situation by means that a bump defect to be eliminated is covered by a carbon deposit layer, the carbon and mask are etched by the same rate until the bump defect is exposed, a carbon line is formed on the etched portion having a straight shape from view of the upper side over the surface, and an etching is performed until the discrepancy amount between the etched carbon surface and the carbon line on the flat mask surface with the observation from the oblique direction of the surface. Accordingly, it is possible to observe in situ a depth of the etching, thereby eliminating the bump defect with high accuracy.

In this case, when the height of the bump defect is measured by using a height measurement by the carbon line and the layer thickness of the carbon deposit layer is determined on the basis of the measured value, it is possible to high efficiently perform a high proper etching.

Furthermore, the apparatus for repairing the defect of the phase shift mask according to the present invention operates the beam radiating means, the hydro-carbon supply means and the tilting means on the basis of the observed result of the surface observation means, thereby eliminating in high accuracy the bump defect by means of depositing and etching to the phase shift mask by a predetermined pattern, and performing an etching of the carbon and the mask material under the condition of the selectivity of "1".

As described above, it is clear that the present invention can stop the etching in the manner of coinciding with glass substrate surface and etching surface when the focus ion beam generation apparatus performs a sputter etching in the repair of the phase shift mask, thereby resulting that it is possible to correct the defect in high accuracy.

DETAILED DESCRIPTION OF THE PREFERRED EMBODIMENTS

There will be described in detail method and apparatus for repairing a defect of a phase shift mask according to preferred embodiments of the present invention in reference with the attached drawings.

Figure 1:
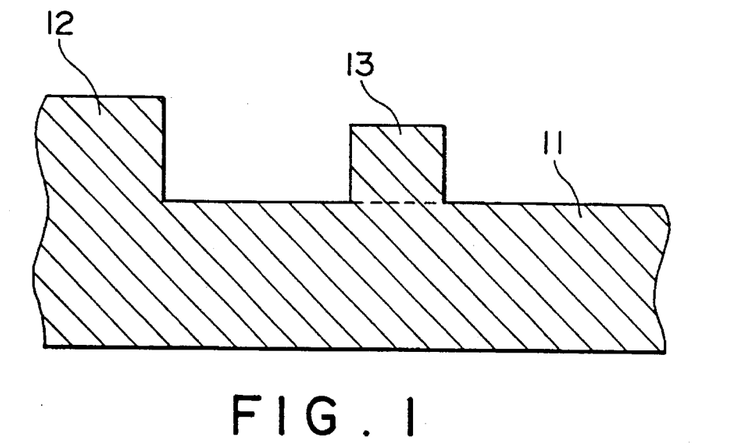
FIG. 1 is a sectional view showing a phase shift mask as an applied object of the present invention.

FIG. 1 shows an example of a defect of a phase shift mask. The phase shift mask is called an attenuated phase shift type, in which a glass substrate 11 of $SiO_2$ is etched to a depth of a phase inverted with just 180°, thereby forming a phase shift mask region 12 having been patterned. In an etching step for forming the phase shift mask region 12, a region to be etched is not etched by a dust and the like, thereby leaving $SiO_2$ on the glass substrate 11 so as to result a bump defect 13 shown as a model in the figure.

Such the bump defect 13 is considered as the most representative defect in the phase shift mask.

Figure 2A:
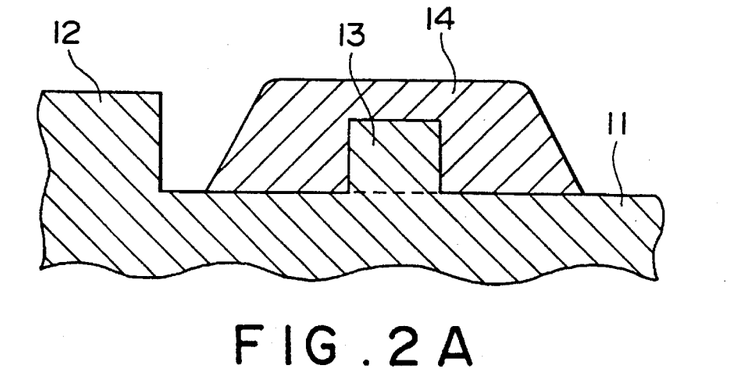
FIGS. 2A and 2B are sectional views respectively showing a phase shift mask for explaining a method of repairing a defect of a phase shift mask according to the present invention.

In the case where the bump defect 13 is eliminated, as shown in FIG. 2A, a carbon deposit layer 14 is first deposit by an ion beam assist deposition and the like on the glass substrate 11 in the manner of avoiding the phase shift mask region 12 and covering the bump defect 13. This layer 14 can be deposited by radiating an ion beam or an electron beam with supplying a glass including a hydrocarbon.

Figure 2B:
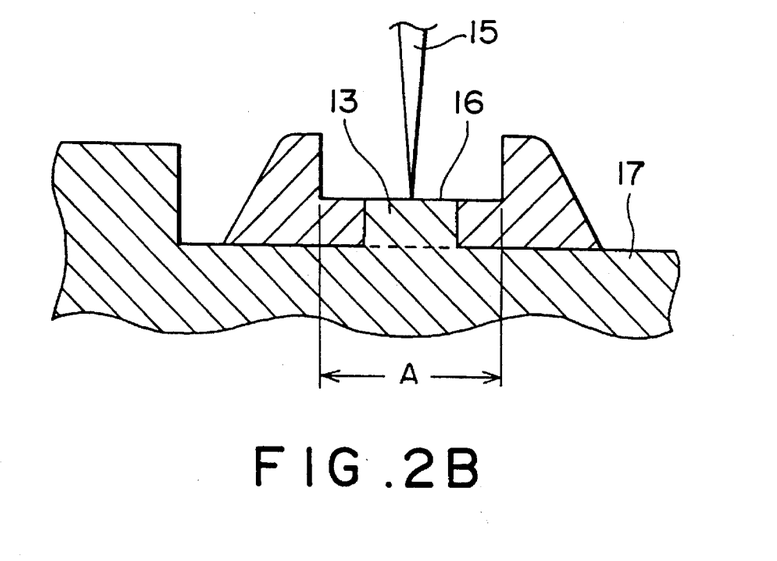

Next, a raster scanning of an ion beam 15 causes a region A, which has the bump defect 13 as a center and is wider than the bump defect 13 as shown in FIG. 2B, to be etched. At this time, an energy of an ion beam ordinarily applied with gallium (Ga) beam is properly set, or an assist etching is performed with supplying an etching glass, thereby making a condition of an etching rate 1:1 between the carbon and $SiO_2$, namely, an etching is performed with a selectivity of "1". As a result, a sputter surface 16 is formed in the manner of substantially making the same plane by the bump defect and the carbon around the defect.

It is necessary to stop an etching when the sputter surface 16 becomes the same depth of a substrate plane 17 of the glass substrate 11 as a foundation. In this case, a thickness is obscure with respect to a carbon which is deposited around of the bump defect 13. Accordingly, it is necessary to detect that the sputter surface 16 becomes the height as the same as that of the glass substrate plane 17 by measuring in situ the depth of the carbon with performing an etching. As shown in FIG. 2B, the etching is stopped at the condition that the bump defect 13 is exposed or faintly etched.

Figure 3A:
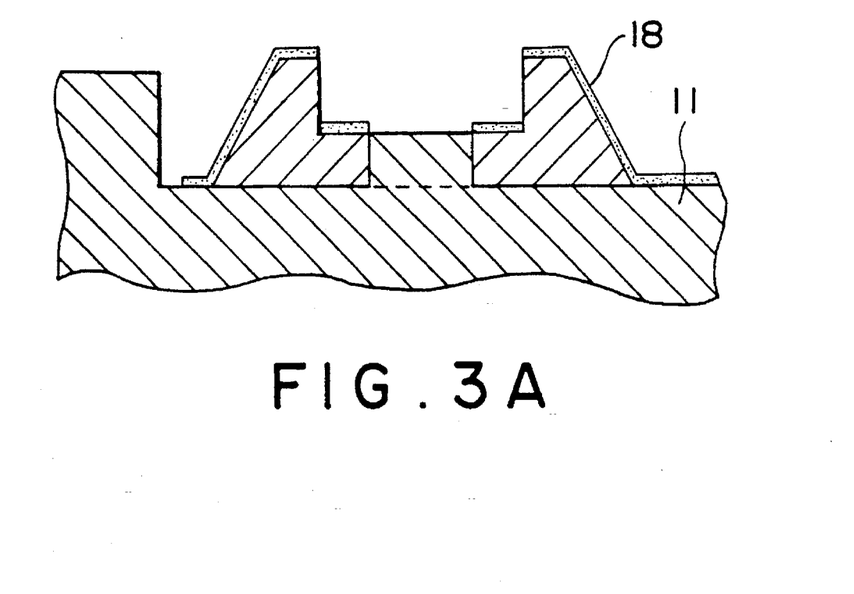
FIGS. 3A and 3B are sectional view and plan view of the phase shift mask for respectively explaining the method of repairing the defect of the phase shift mask according to the present invention.
Figure 3B:
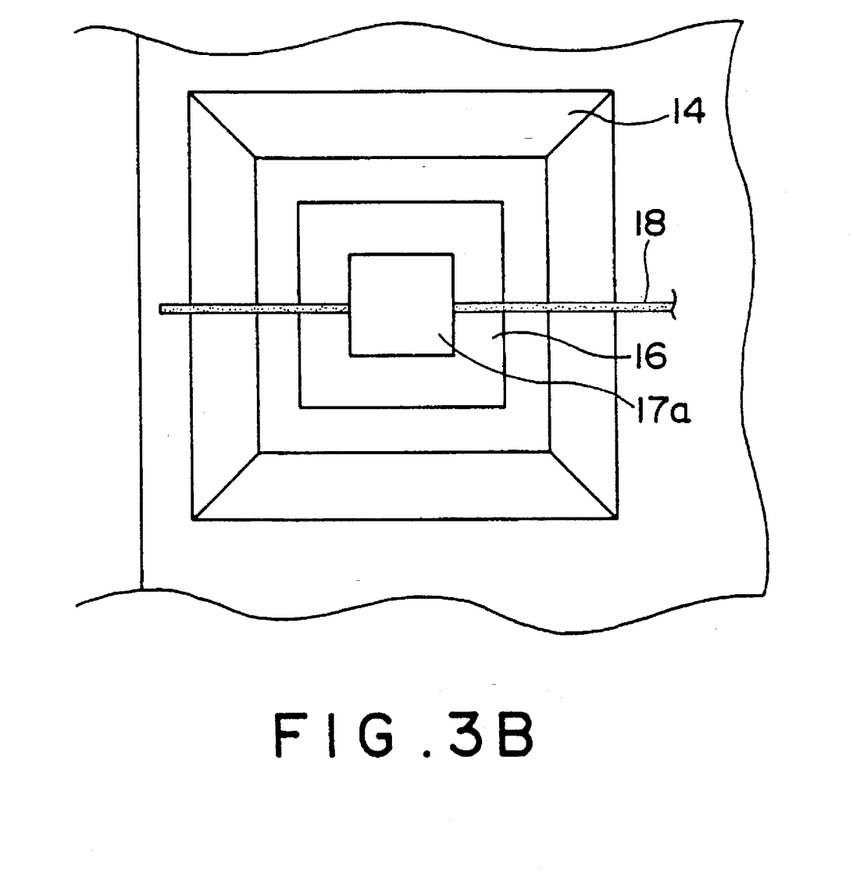

Next, a carbon deposit line 18 is formed in a plane and straight line shape by an ion beam assist deposition on the glass substrate plane 17 and a carbon region on which the carbon is deposited, as shown in the sectional view of FIG. 3A and the plan view of FIG. 3B. At this time, a carbon is not deposited on an exposed surface of the glass substrate plane 17. The carbon deposit line 18 is formed on a plane shape and substantially on the center axis of the bump defect 13. After these works are performed, an etching in an area restarts by an ion beam assist etching. Even though the etching advances, a carbon line 19 caused by the carbon deposit line 18 remains as it is.

Figure 4A:
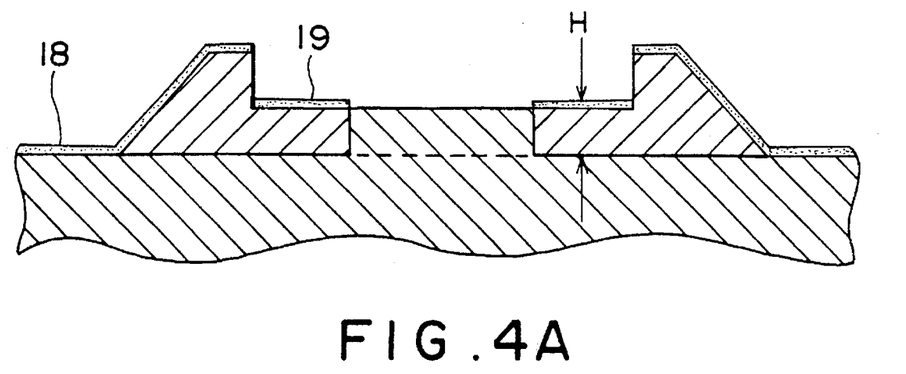
FIGS. 4A and 4B are sectional view and perspective view of the phase shift mask and the observed image for respectively explaining the method of repairing the defect of the phase shift mask according to the present invention.
Figure 4B:
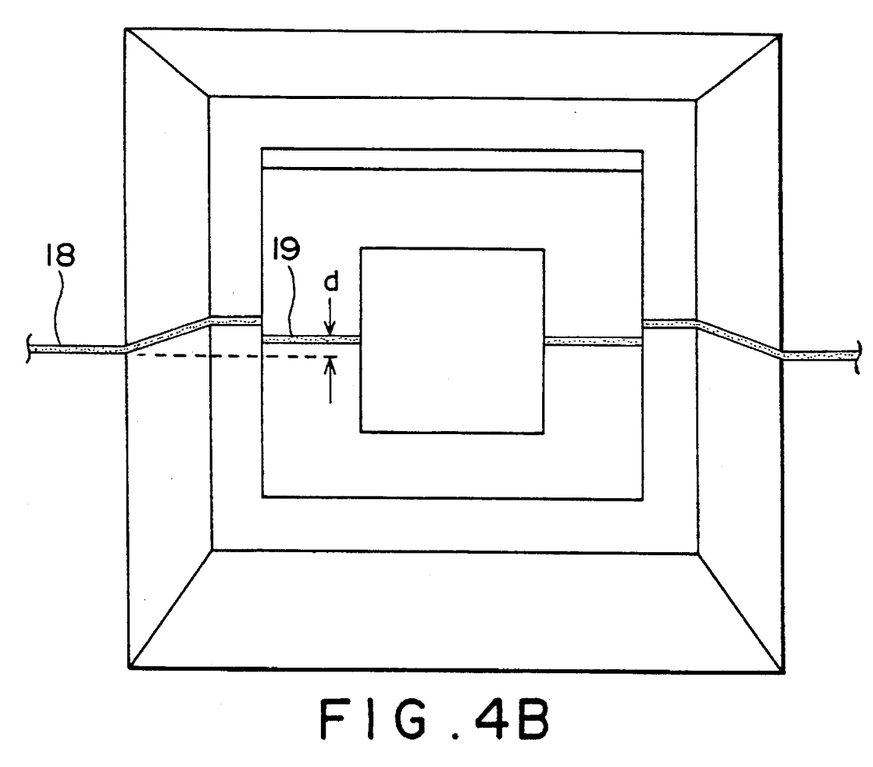
Figure 5A:
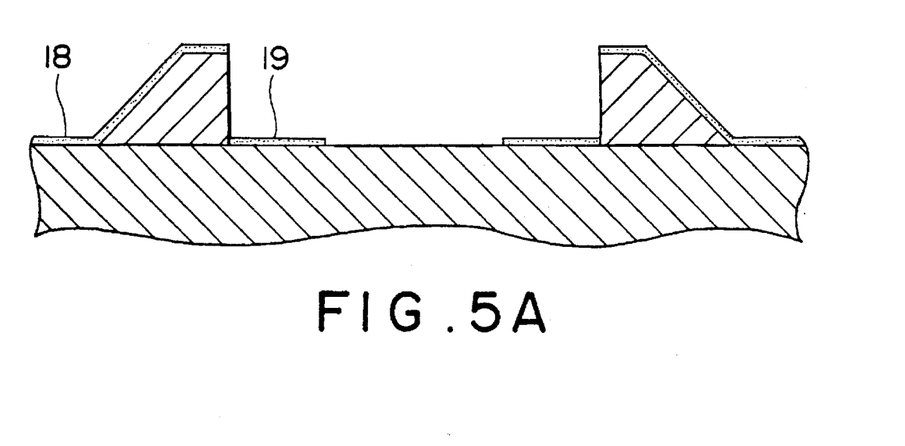
FIGS. 5A and 5B are sectional view and perspective view of the phase shift mask and the observed image for respectively explaining the method of repairing the defect of the phase shift mask according to the present invention.
Figure 5B:
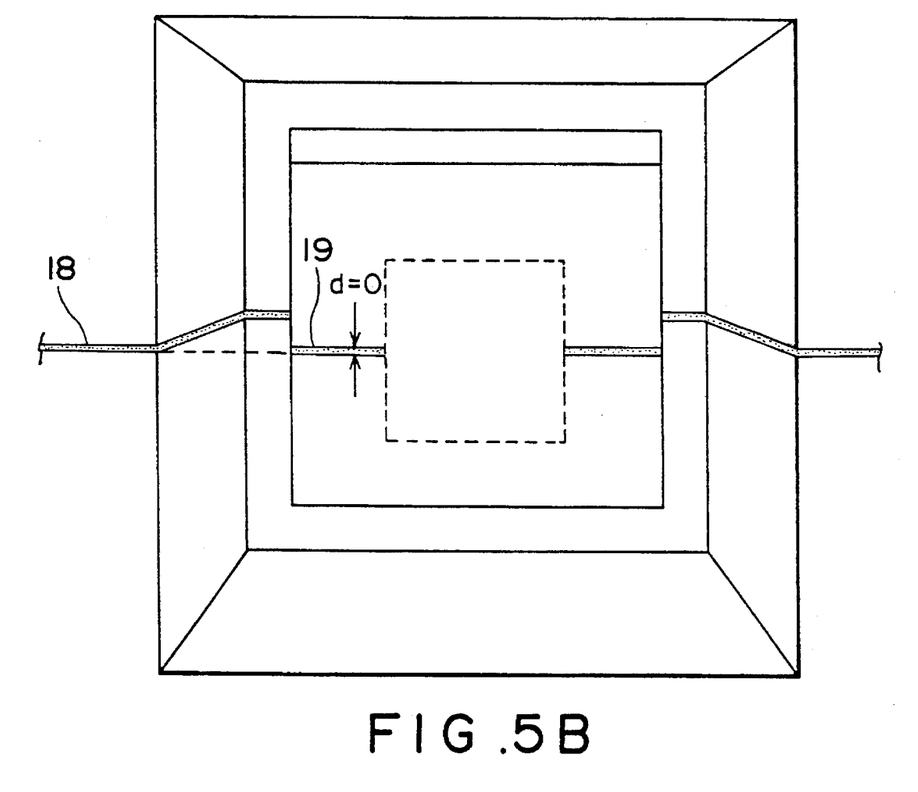

Next, a sample having the carbon deposit line 18 and the carbon line 19 is tilted to observe a secondary electron image from the slant direction to a surface of the glass substrate 11, thereby obtaining an object shown in FIG. 4B corresponding to the sectional view of FIG. 4A. At this time, the sample is tilted by using the carbon line 19 as the axis. Here, if the carbon deposit line 18 does not coincide with the carbon line 19 on the straight line, namely, when there is a discrepancy d, an etching amount is shortage, and the etching is continued. A measurement of the discrepancy d makes a remaining etching amount H shown in FIG. 4A be obtained by the following equation (2).

$$d = H \sin \Phi \quad (2)$$

where $\Phi$ is a slant angle against a vertical axis virtual to the glass substrate 11.

When an etching sufficiently advances to result a perfect coincidence between the etched bottom surface and the glass substrate plane 17, the carbon deposit line 18 and the carbon line 19 are positioned on the straight line, and the discrepancy amount d becomes zero. This time is an ideal stop timing of the etching, and the bump defect 13 existing on the glass substrate 11 is perfectly eliminated by the repair to be the glass substrate plane 17 having a flat plane. After this, the remaining carbon deposit layer is eliminated.

Figure 6:
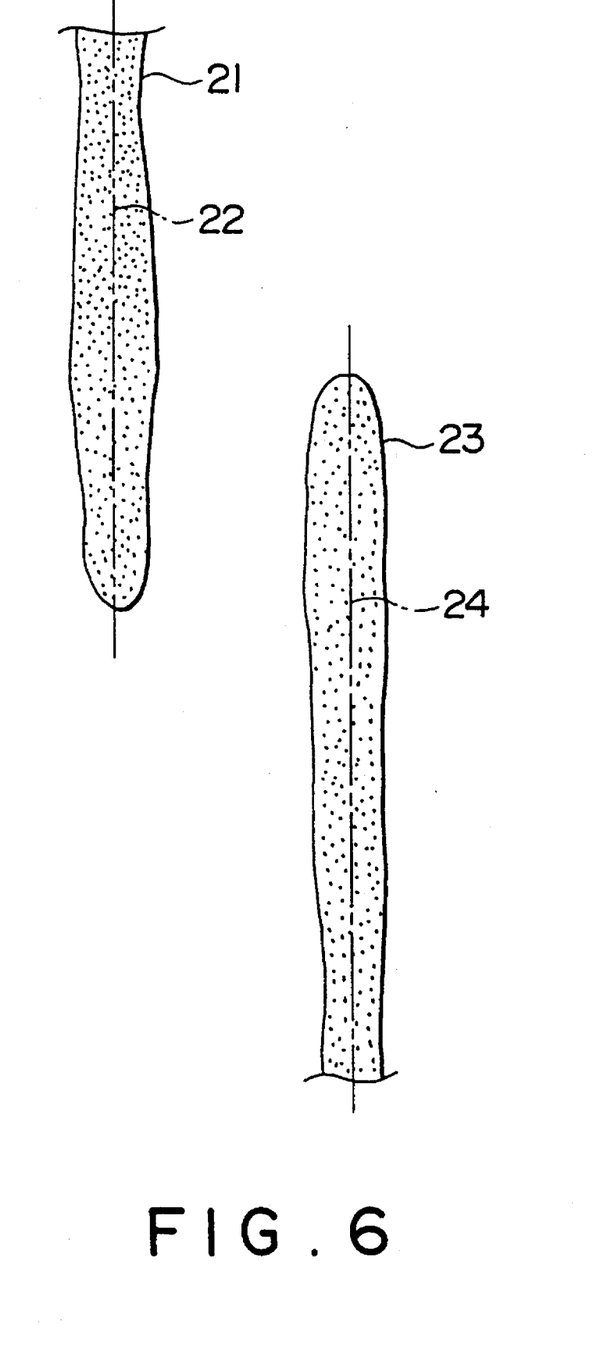
FIG. 6 is a view showing a perspective observation image for explaining a method of repairing a defect of the phase shift mask according to the present invention.

By the way, images of the carbon deposit line 18 and the carbon line 19 by the secondary electron image have the possibility are blurred by a stretch of the beam diameter as shown in FIG. 6. Since it is necessary to be discrepancy of the center lines of two carbon lines, each of the center lines 22 and 24 of each of images is obtained by the image processing from the carbon line images 21 and 23 which are actually blurred, thereby obtaining the difference therebetween.

Accordingly, the embodiment can measure in situ the depth of the etching, thereby eliminating the bump defect in a high accuracy.

As described above, since the carbon deposit layer 14 is formed by covering the bump defect 13 for a repair, it is desired to previously establish how much the layer is deposit at this time. The above measuring method may apply to a carbon depositing in order to achieve this purpose.

Accordingly, after the carbon deposit line is formed on the bump defect and glass substrate plane by the ion beam assist deposition under the condition that the sample faces in the right angle with the ion beam, since the tilted sample is observed as the same manner of the measurement of the above etching depth, it is possible to quantitatively measure the height of the bump defect on the basis of the discrepancy of the carbon lines on the secondary electron image. In this case, since a carbon is further deposited thereon, the previously deposit carbon adds no obstacle in the succeeding processes. Furthermore, the observation in the oblique direction to the carbon line is effective to comprehend the shape of the defect. Accordingly, it is possible to optimize a carbon deposit amount by way that the height and shape of the defect have been previously known, thereby repairing the defect in a high efficiency.

Figure 7:
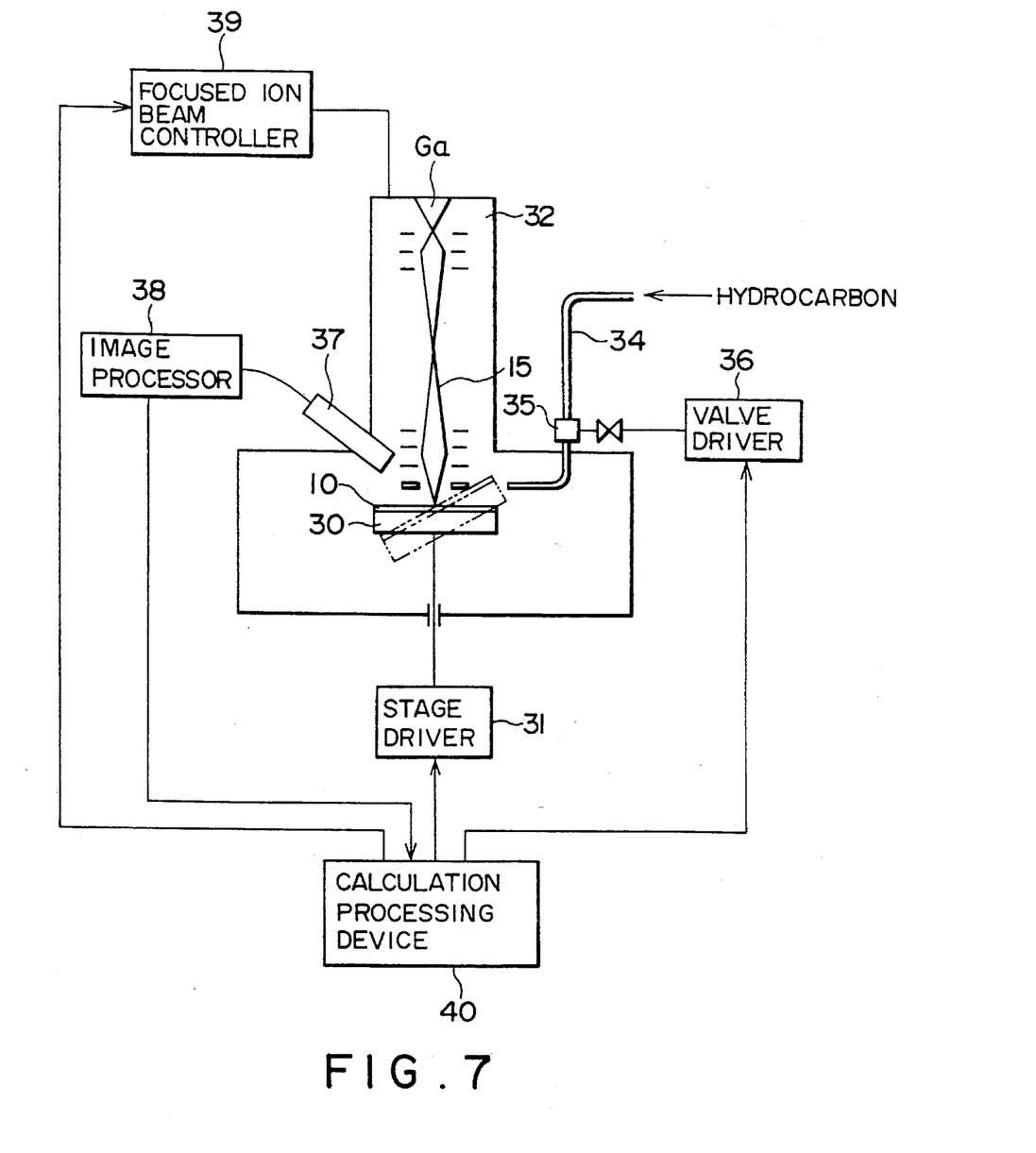
FIG. 7 is a schematic construction view of an apparatus for repairing a defect according to an embodiment of the present invention.

FIG. 7 is a schematic construction view of a defect repair apparatus to embody the above-mentioned method for repairing the defect.

A phase shift mask 10 is disposed on a stage 30 which is tilted by a stage driver 31. A focus ion beam generation device 32 generates an ion beam 15 of gallium (Ga) to radiate onto a surface of the phase shift mask 10, and comprises a focus ion beam controller 39 for controlling an energy, current amount, radiation angle and the like on the basis of a control signal. The apparatus comprises a hydrocarbon supply pipe 34 for supplying a hydro-carbon from an outside, a control valve 35 provided at the intermediate portion of the pipe 34 for controlling a supply amount of the hydro-carbon, and a valve driver 36 connected with the control valve 35 for controlling the valve 35. 0n the other hand, a secondary electron detector 37 is provided for detecting a secondary electron which is generated from the surface of the phase shift mask 10 because of an radiation of the electron beam 15, an image processor 38 which is connected with the secondary electron detector 37 for processing an image responsive to a detection signal of the detector 37, and a calculation processing device 40 for receiving an output signal of the image processor 38 to supply a control signal to the stage driver 31, the valve driver 36 and the focus ion beam controller 39.

Here, the calculation processing device 40 supplies the control signal to the ion beam control device 39 and the valve driver 36 under the condition of supporting the stage 30 in the horizontal position, and at the same time, forms a carbon deposit layer 14 on a glass substrate plate 11 on the basis of the control signal of the image processor 38 as shown in FIG. 2A. Next, the calculation processing device 40 sets an energy of the beam to a proper value to perform an assist etching under the condition of a selectivity of "1"

between the carbon and $SiO_2$, and performs an etching a wider region A around the bump defect 13 as shown in FIG. 2B by a raster scanning of the ion beam 15, thereby forming a sputter surface 16 which forms the substantially same plane with the bump defect and the carbon around the defect.

Next, the calculation processing device 40 supplies the control signal to the valve driver 36 and the focus ion beam control device 39, thereby forming the carbon deposit line 18 shown in FIG. 3, then to start again an etching in a predetermined area by the ion beam assist etching. The calculation processing device 40 tilts the stage 30, obtains the discrepancy amount d between the carbon deposit line 18 and the carbon line 19 on the basis of image signal which is observed to the surface of the mask at a predetermined angle by the tilted stage, and obtain the etching remaining amount H as shown in FIG. 4A.

Next, the calculation processing device 40 returns the condition of the stage 30 tilted so as to stop an etching at a step that an etched bottom surface and the glass substrate plate 17 perfectly coincides with each other, and after that, the remaining carbon deposit layer is eliminated.

Figure 8:
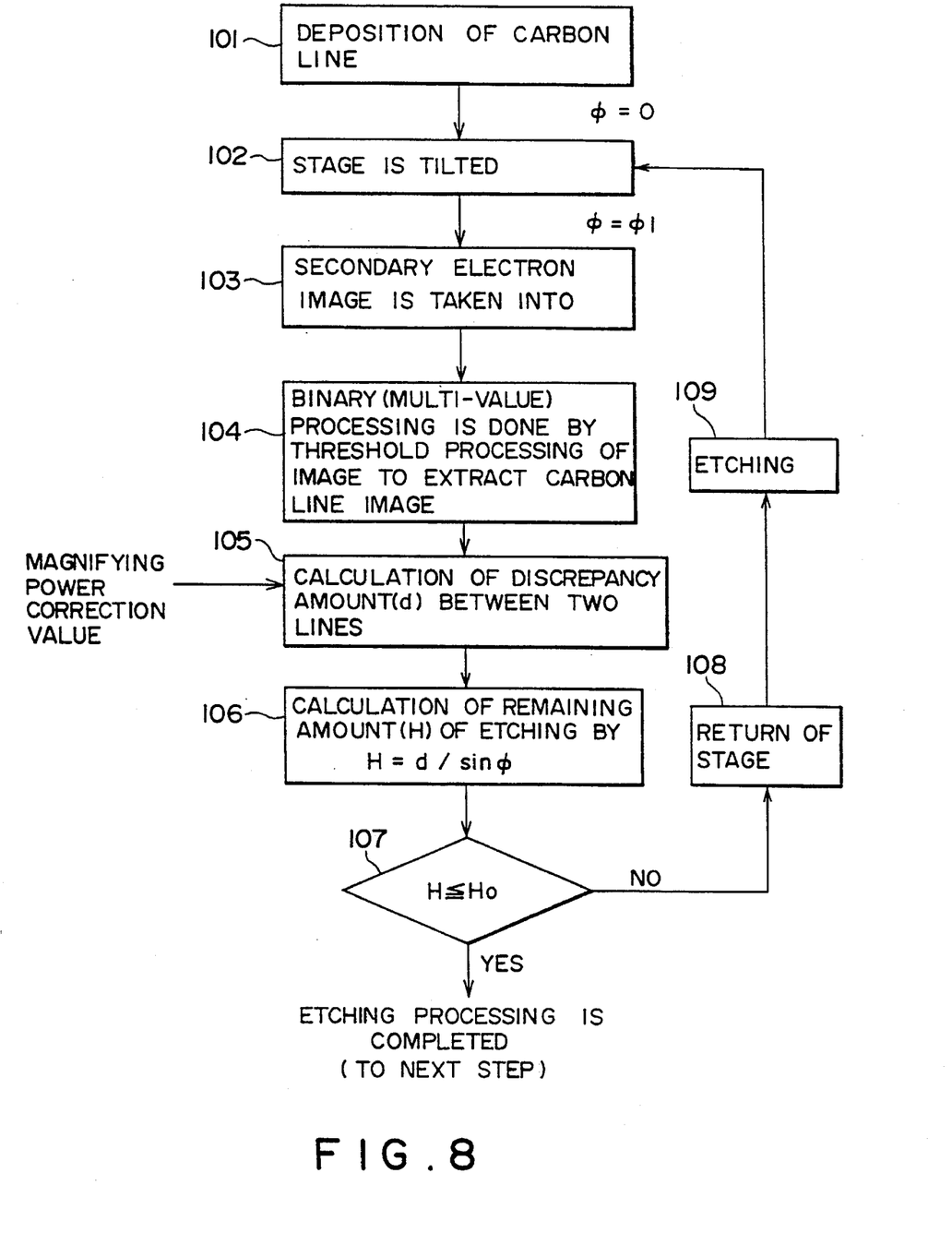
FIG. 8 is a flow chart for explaining operation of the apparatus for repairing the defect of the phase shift mask according to the embodiment of the present invention.
Figure 9:
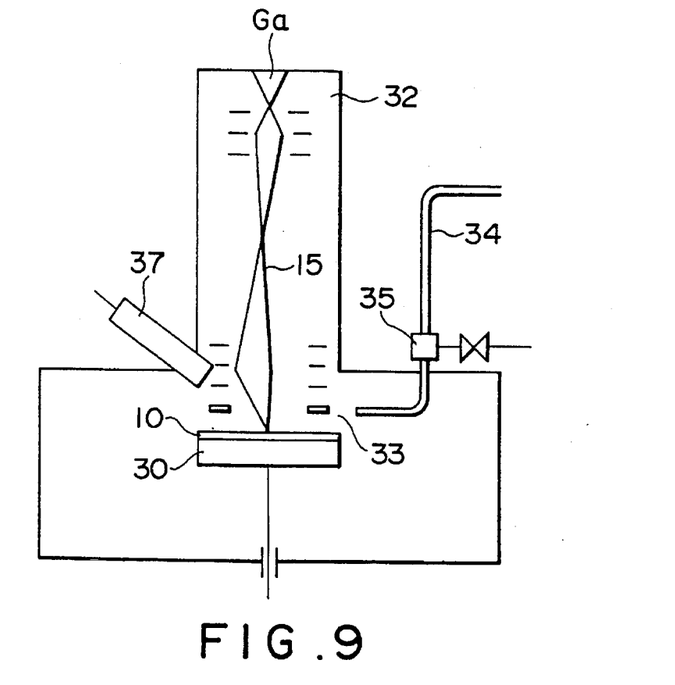
FIG. 9 is a schematic construction view showing an apparatus for repairing a defect of a phase shift mask according to another embodiment of the present invention.

FIG. 8 is a flow chart showing a processing procedure of the calculation processing device 40 which executes the above-mentioned processing. A carbon is deposited in the manner of covering the bump defect on the glass substrate plate to form the carbon deposit layer, and after a portion of the deposit region of the carbon deposit layer and wider than the bump defect is etched under the condition of the sectional proportion of 1 of the etching rate between the carbon and the mask material until the bump defect is exposed, as shown in the flow chart, the defect repair starts by the in situ method.

Here, in step 101, a carbon line is first deposited under the condition that the oblique angle $\Phi$ of the stage is $\Phi=0°$.

Next, in step 102, the stage 30 is tilted in a predetermined angle, for example, $\Phi=\Phi_1$. The angle $\Phi_1$ is within a range capable of observing both of the carbon line on the surface of the carbon deposit layer and the carbon deposit line (hereafter, simply called as a carbon line) on the flat mask surface, and is suitable to substantially to be within 10°–20°.

In step 103, the secondary electron image is taken into an image memory to be stored by means of a raster scanning of the ion beam under the condition that the stage 30 is oblique. The secondary electron image is that secondary electrons occurring as the result of the beam scanning are converted into an electric signal by a secondary electron detector such as a micro channel plate (MCP), scintillator photo-multiplier and the like, and the electric signal is digitized by an A/D converter to store in the image memory.

In step 104, in order to extract a carbon line from the taken secondary electron image, a threshold processing is performed for classifying a contrast of the image into a contrast value of a background and a contrast value of the carbon line so as to make the image be a multi-value. The simplest processing of the multi-value is a binary processing. As the result, a signal of the background is erased and only a contrast of the carbon line remains.

Next, in step 105, there is calculated a position discrepancy amount d between the carbon line of the bump defect surface region and the carbon deposit line on the flat mask surface amongst these carbon lines. At this time, a repair value of the magnifying power for the observation image, namely, a number of micron (μm) corresponding to one pixel, is previously measured by an observation magnifying power so as to be corrected.

Next, in step 106, the remaining amount H of an etching is calculated by using an oblique angle at an observation on the basis of a calculated position discrepancy amount d.

The processing of steps 104–106 are operated by a computer.

Next, in step 107, the computer also judges as to whether or not the obtained value H is included within a predetermined allowable value $H_0$. If the value H is on or more than the allowable value $H_0$, the oblique angle $\Phi$ of the stage returns to $\Phi=0°$ again in step 108. In step 109, an etching is continued in a predetermined time, and the above-mentioned operation is going to be continued hereinafter. The etching is completed at the stage that the value H becomes within the allowable value $H_0$, and operation advances to a process for eliminating the remaining carbon.

Even though there is described the case where the sample on the stage 30 is tilted for observing an etching rate as the simplest method in the above embodiment, since the present invention can only observe the sample in the oblique direction, the same effect can be obtained by changing a condition for supplying a voltage of operation electrode 33, namely, by constituting an objective lens of the ion focus system from a moving objective lens (MOL), thereby changing a radiated angle of the ion beam to be oblique for an observation.

Figure 10:
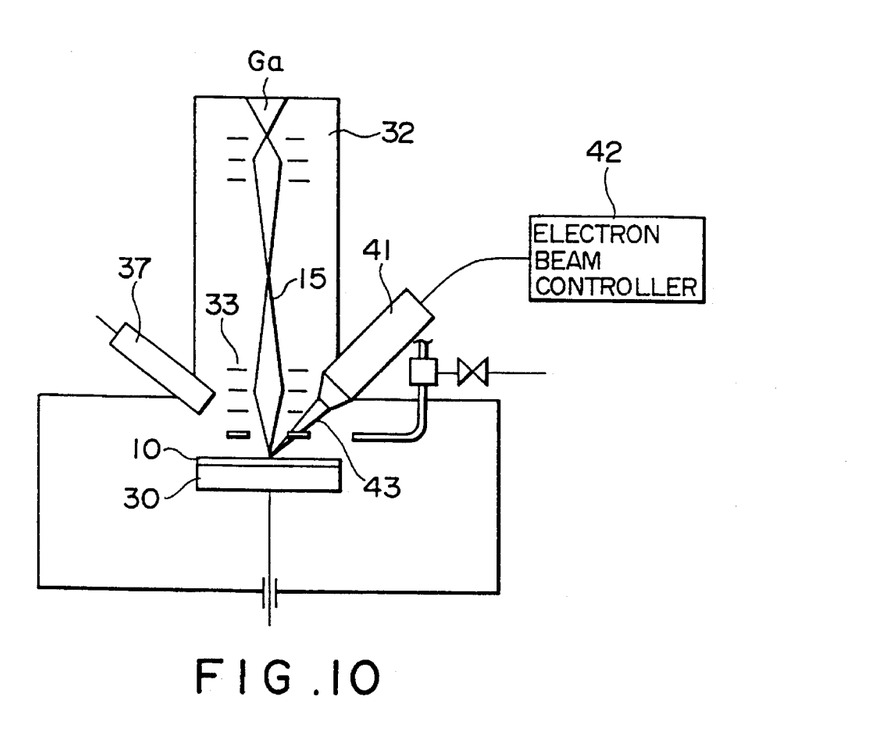
FIG. 10 is a schematic construction view showing an apparatus for repairing a defect of a phase shift mask according to still further embodiment of the present invention.

Furthermore, since an electron beam column for an observation is provided commonly to an ion beam column for an etching, it is possible to efficiently perform an etching and an observation. In this case, it is possible to use an electron beam which can easily slenderize a beam having a spatial resolving power for an observation. In detail, as shown in FIG. 10, the apparatus may comprise an observation ion beam generation apparatus 41 for generating an electron beam for an observation in the oblique direction, and a controller 42 for controlling the ion beam generation apparatus, in addition with the focus ion beam generation device 32 for radiating an ion to the phase shift mask 10 from the vertical direction.

What is claimed is:

1. A method for repairing a defect of a phase shift mask by eliminating a bump defect having a partially projected shape from a region to be flat, said method comprising:

a step of depositing a carbon in the manner of covering said bump defect to form a carbon deposit layer;

a step of etching a partial region including said bump defect and being wider than said bump defect in a carbon deposit region of said carbon deposit layer under the condition that an etching rate of a carbon and a mask material is 1:1 of a selectivity, until said bump defect is exposed;

a step of depositing a carbon along a straight line in view of a vertical direction to a mask surface in the manner of including an etched surface of said carbon deposit layer and a flat surface of said mask material so as to form a carbon deposit line;

a step of measuring a discrepancy amount between a carbon line on a remaining surface on said carbon deposit layer after an etching and a carbon deposit line of said flat surface of said mask material by an observation in the oblique direction to the mask surface of said phase shift mask;

a step of etching said partial region under the condition that an etching rate of a carbon and a mask material is 1:1 of a selectivity, until said discrepancy amount becomes zero; and a step of perfectly eliminating said carbon deposit layer and said carbon line remaining on said phase shift mask.

2. The method for repairing the defect of the phase shift mask according to claim 1, further comprising a step of measuring said discrepancy amount between said carbon lines by an observation substantially in the oblique direction to the mask surface of said phase shift mask, by means of radiating a primary ion beam in an angle oblique to a virtual axis virtual to the mask surface.

3. The method for repairing the defect of the phase shift mask according to claim 1, further comprising a step, previous to a formation of said carbon deposit layer, of depositing a carbon along a straight line in view of the vertical direction to the mask surface in the manner of including said flat surface of the mask and a surface of said bump defect;

a step of calculating a height of said bump defect and of measuring said discrepancy amount between said carbon deposit line on the surface of the bump defect and said carbon deposit line on the flat surface of said mask by an observation from the direction oblique to the surface of said phase shift mask; and a step of determining a layer thickness of said carbon deposit layer on the basis of said height of said bump defect calculated in the above step.

4. The method for repairing the defect of the phase shift mask according to claim 3, further comprising a step of measuring the discrepancy amount between said carbon lines by an observation substantially in the oblique direction to the surface of said phase shift mask, by means of radiating a primary ion beam in an angle oblique to a virtual axis virtual to the mask surface.

5. An apparatus for repairing a defect of a phase shift mask by eliminating a bump defect having a partially projecting shape from a region to be flat, comprising a stage for supporting said phase shift mask as an object for a repair;

beam radiation means for radiating a focus ion beam to said phase shift mask;

hydro-carbon supply means for supplying a hydro-carbon onto a surface of said phase shift mask;

surface observation means for observing said surface of said phase shift mask by detecting a secondary electron;

tilting means for tilting an observation angle of said surface observation means to said phase shift mask; and calculation processing means for manipulating said beam radiation means, said hydro-carbon supply means and said tilting means on the basis of an observation result of said surface observation means to make said phase shift mask be deposited by a carbon and etched, and to make said carbon and a mask material be etched under the condition of a selectivity of 1:1.

6. The apparatus for repairing the defect of the phase shift mask according to claim 5, wherein said tilting means operates to make said stage be tilted.

7. The apparatus for repairing the defect of the phase shift mask according to claim 5, wherein said tilting means operates to make said beam radiation means change an incident angle of said focus ion beam.

8. An apparatus for repairing a defect of a phase shift mask by eliminating a bump defect having a partially projecting shape from a region to be flat, comprising a stage for supporting said phase shift mask as an object for a repair;

beam radiation means for radiating a focus ion beam to said phase shift mask;

hydro-carbon supply means for supplying a hydro-carbon onto a surface of said phase shift mask;

surface observation means for observing said surface of said phase shift mask by detecting a secondary electron;

observation beam radiating means for radiating an electron beam onto a surface of said phase shift mask in the oblique direction; and calculation processing means for manipulating said beam radiation means, said hydro-carbon supply means and said observation beam radiating means on the basis of an observation result of said surface observation means to make said phase shift mask be deposited by a carbon and etched, and to make said carbon and a mask material be etched under the condition of a selectivity of 1:1.

* * * * *